United States Patent
Enomoto (10) Patent No.: US 11,456,275 B2
(45) Date of Patent: Sep. 27, 2022

(54) SEMICONDUCTOR DEVICE AND METHOD OF MANUFACTURING SEMICONDUCTOR DEVICE

(71) Applicant: Fuji Electric Co., Ltd., Kanagawa (JP)

(72) Inventor: Kazuo Enomoto, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/584,354

(22) Filed: Sep. 26, 2019

(65) Prior Publication Data
US 2020/0118965 A1 Apr. 16, 2020

(30) Foreign Application Priority Data
Oct. 16, 2018 (JP) .............................. JP2018-195029

(51) Int. Cl.
*H01L 23/00* (2006.01)
*H01L 23/13* (2006.01)
(Continued)

(52) U.S. Cl.
CPC .............. *H01L 24/80* (2013.01); *H01L 23/13* (2013.01); *H01L 23/3185* (2013.01);
(Continued)

(58) Field of Classification Search
CPC ..... H01L 24/80; H01L 23/13; H01L 23/3185; H01L 23/49513; H01L 23/49548; H01L 23/49575; H01L 24/29; H01L 2224/0603; H01L 24/32; H01L 24/83; H01L 2224/26175; H01L 2224/291; H01L 2224/32013; H01L 2224/32014; H01L 2224/32058; H01L 2224/32225; H01L 2224/32238; H01L 2224/48137; H01L 2224/48227; H01L 2224/4911; H01L 2224/49111; H01L 2224/49175;
(Continued)

(56) References Cited

U.S. PATENT DOCUMENTS

| 5,386,624 A * | 2/1995 | George | H01L 24/29 29/832 |
| 2013/0009311 A1 * | 1/2013 | Lin | H01L 21/486 257/762 |

(Continued)

FOREIGN PATENT DOCUMENTS

| JP | H4-93142 U | 8/1992 |
| JP | H5-243287 A | 9/1993 |

(Continued)

OTHER PUBLICATIONS

Japanese Office Action dated Aug. 9, 2022 in a counterpart Japanese patent application No. 2018-195029.

*Primary Examiner* — Su C Kim
(74) *Attorney, Agent, or Firm* — Chen Yoshimura LLP (57) ABSTRACT

A semiconductor device includes an insulated circuit board in which a metal layer is formed on one surface of an insulating board and a semiconductor element having a polygonal shape when viewed in a plan view that is bonded to the metal layer via a bonding material. The metal layer of the insulated circuit board has a recess that exposes the insulating board at a position corresponding to at least one corner of the semiconductor element.

9 Claims, 7 Drawing Sheets

(51) Int. Cl.
  *H01L 23/31* (2006.01)
  *H01L 23/495* (2006.01)
(52) U.S. Cl.
  CPC .. *H01L 23/49513* (2013.01); *H01L 23/49548* (2013.01); *H01L 23/49575* (2013.01)
(58) Field of Classification Search
  CPC ... H01L 2224/73265; H01L 2224/8321; H01L 2224/83385; H01L 2224/83815; H01L 2924/19107; H01L 23/49838; H01L 23/3735
  See application file for complete search history.

(56) References Cited

U.S. PATENT DOCUMENTS

| | | | |
|---|---|---|---|
| 2014/0022745 A1* | 1/2014 | Ehrenpfordt | B81B 7/0058 361/749 |
| 2014/0077375 A1 | 3/2014 | Hara et al. | |
| 2015/0130053 A1* | 5/2015 | Hara | H01L 25/0657 257/737 |
| 2016/0247978 A1 | 8/2016 | Ishida et al. | |
| 2017/0154836 A1 | 6/2017 | Takizawa | |
| 2018/0012847 A1 | 1/2018 | Onoda et al. | |

FOREIGN PATENT DOCUMENTS

| | | |
|---|---|---|
| JP | 2009-70907 A | 4/2009 |
| JP | 2013-123016 A | 6/2013 |
| JP | 2014-60211 A | 4/2014 |
| JP | 2016-157918 A | 9/2016 |
| JP | 2016-219532 A | 12/2016 |
| JP | 2017-98508 A | 6/2017 |

\* cited by examiner

SEMICONDUCTOR DEVICE AND METHOD OF MANUFACTURING SEMICONDUCTOR DEVICE

BACKGROUND OF THE INVENTION

Technical Field

The present invention relates to a semiconductor device and a method of manufacturing the semiconductor device.

Background Art

Semiconductor devices include a substrate in which a semiconductor element such as an insulated-gate bipolar transistor (IGBT), power metal-oxide-semiconductor field-effect transistor (MOSFET), or freewheeling diode (FWD) is formed and are used in inverters and the like. In semiconductor devices of this type, a semiconductor element of the type listed above is arranged on a metal foil formed on the surface of an insulating substrate (see Patent Documents 1 to 4). The semiconductor element is fixed on the metal foil via a bonding material such as solder, for example.

In a semiconductor device used for power conversion, for example, the device is not always operated at the same load over the entire lifetime thereof. The device may repeatedly be driven and stopped continually, intermittently, or irregularly, and the power load can change in various ways depending on the operating conditions. Moreover, in terms of operating environments, there are constant-temperature environments as well as cases in which there are extreme differences in temperature over the course of the year (such as outdoors). Therefore, the device must have not only long-term electrical durability but also environmental durability (to usage temperatures and the like).

RELATED ART DOCUMENTS

Patent Documents

Patent Document 1: Japanese Patent Application Laid-Open Publication No. 2013-123016
Patent Document 2: Japanese Patent Application Laid-Open Publication No. 2016-219532
Patent Document 3: Japanese Patent Application Laid-Open Publication No. 2014-60211
Patent Document 4: Japanese Patent Application Laid-Open Publication No. 2009-70907

SUMMARY OF THE INVENTION

When a conventionally structured semiconductor device for power conversion is operated over a long period of time, due to the thermal history of being exposed to high temperatures and low temperatures, the semiconductor device may begin to exhibit damage near the edges of the interface between the semiconductor element and the bonding material. As thermal history accumulates and this damage progresses within the bonding material interface, resistance within the electrical circuits increases and heat-dissipating ability decreases, which can eventually lead to failure of the device.

The present invention was made in view of these problems, and one object of the present invention is to provide a semiconductor device and a method of manufacturing the semiconductor device that make it possible to extend lifetime by reducing thermal history-related stress concentration, even over long periods of operation.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device, comprising: an insulated circuit board including an insulating board and a metal layer on the insulating board; and a semiconductor element mounted on the metal layer via a bonding material that covers a substantially entire back surface of the semiconductor element, the semiconductor element having a polygonal shape when viewed in a plan view, wherein the metal layer of the insulated circuit board has a recess that exposes the insulating board thereunder to accommodate an edge of the bonding material, at a position corresponding to at least one corner of the semiconductor element.

In another aspect, the present disclosure provides method of manufacturing a semiconductor device, comprising: preparing an insulated circuit board that includes an insulating board and a circuit pattern made of a metal layer on the insulating board; arranging a semiconductor element on the metal layer with a bonding material interposed therebetween, covering a substantially entire back surface of the semiconductor element, the semiconductor element having a polygonal shape when viewed in a plan view; and melting and thereafter hardening the bonding material so as to bond the semiconductor element to the metal layer, wherein the circuit pattern of the insulated circuit board has a recess that exposes the insulating board thereunder to accommodate an edge of the melted and hardened bonding material, at a position corresponding to at least one corner of the semiconductor element.

The present invention makes it possible to extend the lifetime of a semiconductor device by reducing thermal history-related stress concentration, even over long periods of operation.

It is to be understood that both the foregoing general description and the following detailed description are exemplary and explanatory, and are intended to provide further explanation of the invention as claimed.

DETAILED DESCRIPTION OF EMBODIMENTS

Figure 1A:
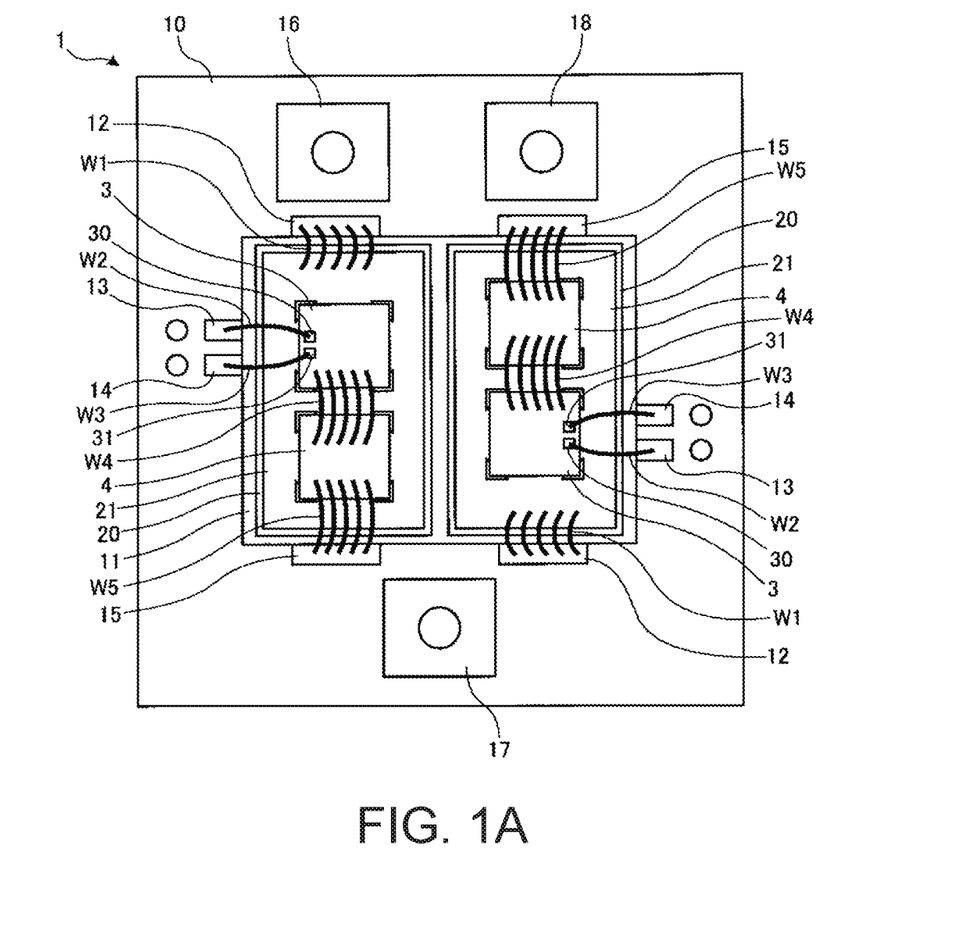
FIGS. 1A and 1B are plan views schematically illustrating examples of a semiconductor device according to an embodiment.
Figure 1B:
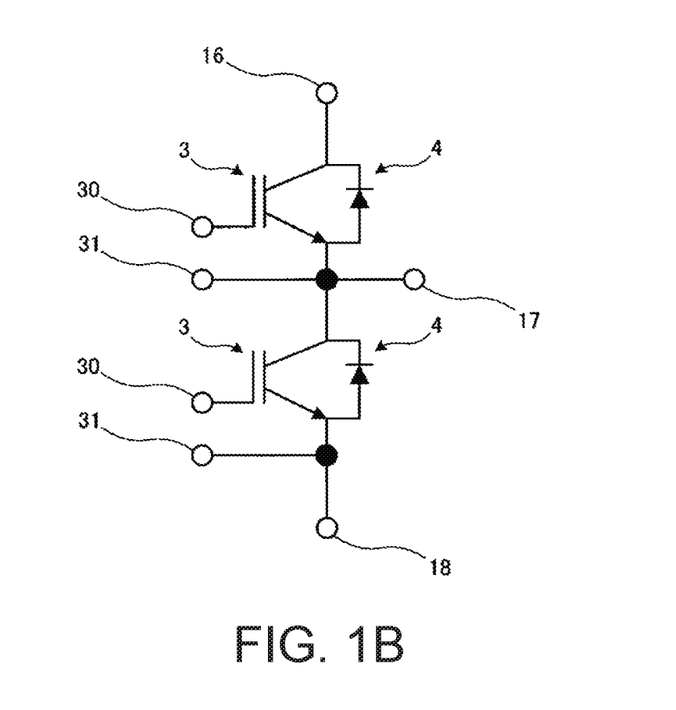

Next, a semiconductor device to which the present invention can be applied will be described. FIG. 1 is schematic drawings illustrating an example of a semiconductor device according to the present embodiment. FIG. 1A is a plan view schematically illustrating the overall semiconductor device, and FIG. 1B is an equivalent circuit diagram of the semiconductor device illustrated in FIG. 1A. It should be noted that the semiconductor device described below is nothing more than an example and is not limited to this example and can be modified as appropriate.

As illustrated in FIG. 1A, a semiconductor device 1 is a device for use in a power module, for example, and includes a base plate 11, insulated circuit boards 2, and semiconductor elements 3 and 4 arranged within a case 10. The base plate 11 has a rectangular shape when viewed in a plan view, and two rectangular insulated circuit boards 2 are arranged on the base plate 11.

Figure 3A:
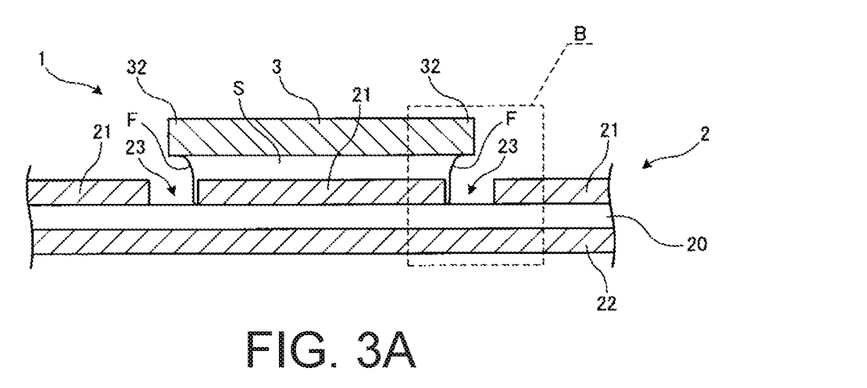
FIGS. 3A and 3B are cross-sectional views taken along line A-A in FIG. 2.

Each insulated circuit board 2 includes metal layers and an insulating layer that are layered together. More specifically, each insulated circuit board 2 includes an insulating board 20 having an upper surface (one surface) and a lower surface (other surface) on the side opposite to the upper surface, a metal layer 21 formed on the upper surface of the insulating board 20, and a metal layer 22 formed on the lower surface of the insulating board 20 (see FIG. 3). A circuit pattern is formed by the metal layer 21. The insulating board 20 is made of an insulator such as a ceramic, and the metal layers 21 and 22 are made of copper foil, for example. In FIG. 1A, the two insulated circuit boards 2 are arranged side by side in the widthwise direction. The insulated circuit boards 2 may be direct copper bonding (DCB) substrates or active metal brazing (AMB) substrates, for example. Each insulating board 20 may be made of a ceramic material such as alumina ($Al_2O_3$), aluminum nitride (AlN), or silicon nitride ($Si_3N_4$).

Two semiconductor elements 3 and 4 are arranged on the metal layer 21 of each insulated circuit board 2. The semiconductor elements 3 and 4 are formed having a rectangular shape when viewed in a plan view in a semiconductor substrate made of silicon (Si) or silicon carbide (SiC) or the like, for example, and are arranged side by side in the lengthwise direction of the insulated circuit board 2. The semiconductor elements 3 and 4 are respectively arranged on the metal layer 21 via a bonding material S (see FIG. 3) such as solder.

Here, switching devices such as insulated-gate bipolar transistors (IGBTs) or power metal-oxide-semiconductor field-effect transistors (MOSFETs) or diodes such as freewheeling diodes (FWDs) are used as the semiconductor elements 3 and 4. Moreover, reverse-conducting (RC) IGBTs in which an IGBT and a FWD are integrated together, reverse-blocking (RB) IGBTs having a sufficient breakdown voltage against reverse bias, or the like may be used as the semiconductor elements 3 and 4. Below, in the present embodiment, the semiconductor elements 3 will be described as being IGBT devices 3, and the semiconductor elements 4 will be described as being diode devices 4.

As illustrated in FIG. 1A, the metal layers 21 of the insulated circuit boards 2 are respectively connected to first electrodes 12 on the base plate 11 via wirings W1. Gate electrodes 30 of the IGBT devices 3 are respectively connected to gate terminals 13 on the case 10 via wirings W2. Sense emitter electrodes 31 of the IGBT devices 3 are respectively connected to emitter terminals 14 on the case 10 via wirings W3. Moreover, emitter electrodes of the IGBT devices 3 and anode electrodes of the diode device 4 are respectively connected via wirings W4. Furthermore, the diode devices 4 are respectively connected to second electrodes 15 on the case 10 via wirings W5.

One first electrode 12 (the left one in FIG. 1A) is connected to a P-terminal 16 (a high voltage-side input terminal) via wiring that is not illustrated in the figure. One second electrode 15 and the other first electrode 12 (the right one in FIG. 1A) are connected to a C-terminal 17 (an intermediate terminal) via wiring that is not illustrated in the figure. The other second electrode 15 is connected to an N-terminal 18 (a low voltage-side input terminal) via wiring that is not illustrated in the figure.

In this way, as illustrated in FIG. 1B, the collector side of one IGBT device 3 and the cathode side of one diode device 4 are electrically connected to the P-terminal 16. Moreover, the emitter side of the one IGBT device 3 and the anode side of the one diode device 4 as well as the collector side of the other IGBT device 3 and the cathode side of the other diode device 4 are electrically connected to the C-terminal 17. Furthermore, the emitter side of the other IGBT device 3 and the anode side of the other diode device 4 are electrically connected to the N-terminal 18. The one IGBT device 3 and the one diode device 4 are connected in anti-parallel and form an upper arm. The other IGBT device 3 and the other diode device 4 are connected in anti-parallel and form a lower arm. The upper arm and the lower arm form a leg.

Here, conductive wires are used for each of the wirings described above. Any single one or combination of gold, copper, aluminum, a gold alloy, a copper alloy, or an aluminum alloy can be used as the material for the conductive wires. Alternatively, components other than conductive wires can be used as the wirings. For example, ribbons can be used as the wirings.

Figure 2A:
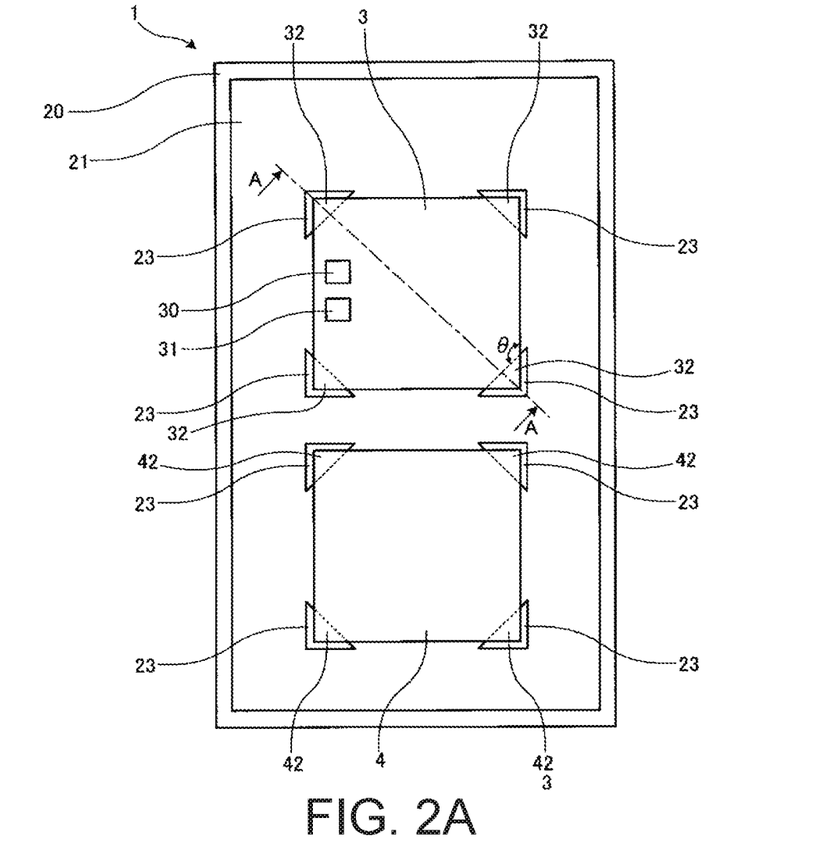
FIGS. 2A and 2B are plan views schematically illustrating one particular portion of the semiconductor device illustrated in FIG. 1.
Figure 2B:
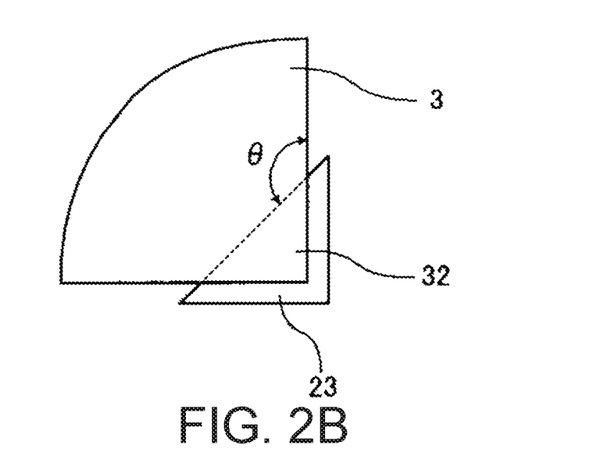
Figure 3B:
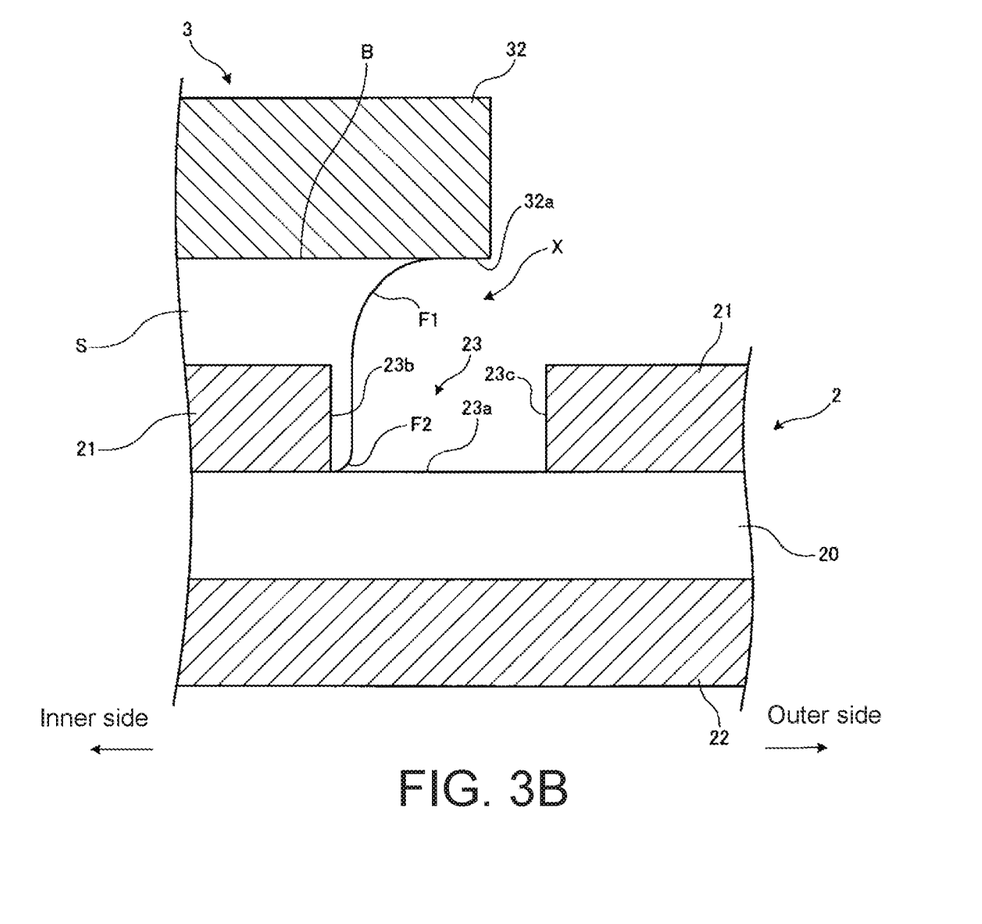

Next, the semiconductor device according to the present embodiment will be described in comparison to a conventional example with reference to FIGS. 2A to 4D. FIG. 2A is a plan view schematically illustrating one particular portion of the semiconductor device illustrated in FIG. 1, and FIG. 2B is an enlarged view of a recess 23 in FIG. 2A. FIG. 3A is a cross-sectional view taken along line A-A in FIG. 2A, and FIG. 3B is an enlarged view of area B in FIG. 3A. FIG. 4 is cross-sectional views schematically illustrating a semiconductor device according to a comparison example (a conventional example) and, in particular, illustrates enlarged views of an area around an outer edge of a semiconductor element. Furthermore, FIGS. 4A to 4D are transition diagrams illustrating a progression until cracking occurs near a bonding surface of the semiconductor element. Note that below, this semiconductor element will be described as being an IGBT device (or diode device) as an example.

As illustrated in FIGS. 2A to 4D, the IGBT device 3 is arranged on the metal layer 21 formed on the surface of the insulating board 20 via the bonding material S. The semiconductor device 1 configured in this manner is exposed to various temperatures depending on the operating environment. In the comparison example as illustrated in FIG. 4A, for example, the bonding material S extends outward from the edge of the IGBT device 3, and the bonding material S forms a fillet F connecting smoothly from the edge (outer peripheral edge) of the IGBT device 3 to the surface of the metal layer 21. Here, as the device is repeatedly operated in high-temperature environments and low-temperature environments, accumulation of thermal stress (known as "thermal history") at an interface B between the IGBT device 3 and the bonding material S can potentially cause cracks and damage to develop near the edge of this interface B.

Figure 4A:
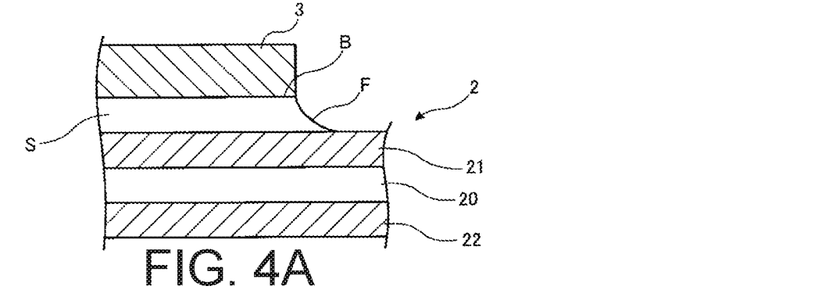
FIGS. 4A through 4D are cross-sectional views schematically illustrating a semiconductor device according to a comparison example.
Figure 4B:
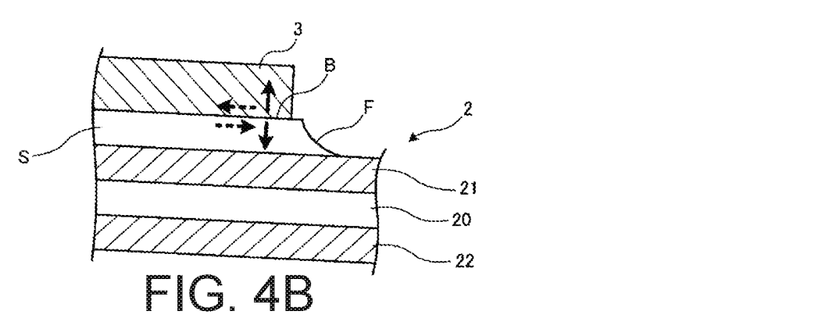

As the IGBT device 3 generates heat, a temperature difference develops between the metal layer 21 and the metal layer 22, and due to differences between the coefficients of thermal expansion of the metal layers 21 and 22 and the insulating board 20, the insulated circuit board 2 warps in a convex manner towards the IGBT device 3 side. Furthermore, due to differences between the coefficients of thermal expansion of the material of the IGBT device 3 and the material of the bonding material S, an offset develops at the edge of the interface B. For example, the bonding material S has a greater coefficient of thermal expansion than the IGBT device 3. As illustrated in FIG. 4B, in high-temperature environments, the bonding material S expands significantly in comparison to the IGBT device 3 towards the outer side of the planar direction of the insulated circuit board 2. As a result, the overall semiconductor device 1 undergoes warping, with the IGBT device 3 side taking a convex shape relative to the bonding material S. At this time, the IGBT device 3 gets offset inwards towards the center of the insulated circuit board 2, while the bonding material S gets offset towards the outer side of the insulated circuit board 2. This causes shear stress to develop at the interface B in the directions indicated by the dashed arrows (directions parallel to the planar direction). Moreover, as indicated by the solid arrows, at the edge of the interface B, tensile stress develops in the direction of the IGBT device 3 and the bonding material S being peeled apart (the direction of moving these components apart from one another).

Figure 4C:
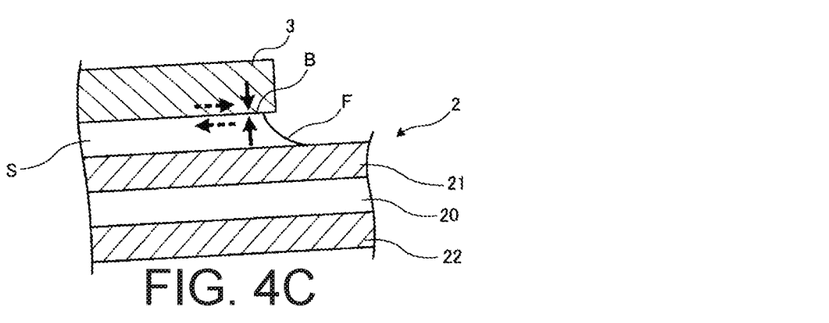

Furthermore, as illustrated in FIG. 4C, in low-temperature environments, the bonding material S contracts significantly in comparison to the IGBT device 3 towards the inner side of the planar direction of the insulated circuit board 2. As a result, the overall semiconductor device 1 undergoes warping, with the IGBT device 3 side taking a concave shape relative to the bonding material S. At this time, the IGBT device 3 gets offset towards the outer side of the insulated circuit board 2, while the bonding material S gets offset towards the inner side towards the center of the insulated circuit board 2. This causes shear stress to develop at the interface B in the directions indicated by the dashed arrows. Moreover, as indicated by the solid arrows, at the edge of the interface B, compressive stress develops in the direction of the IGBT device 3 and the bonding material S being compressed together (the direction of moving these components towards one another).

Figure 4D:
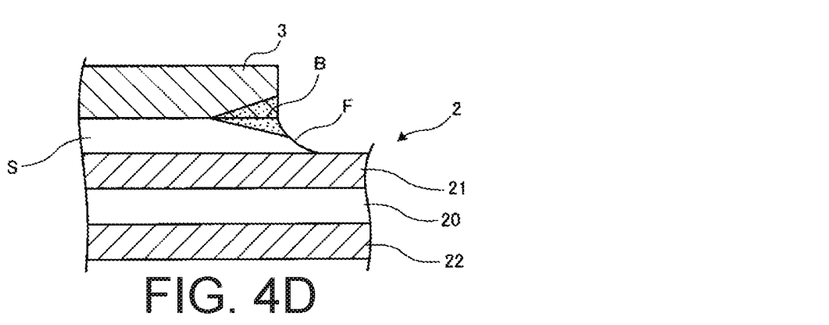

As illustrated in FIG. 4D, as the phenomena illustrated in FIGS. 4B and 4C are repeated a plurality of times, damage at the edge of the interface B resulting from breakage of the chip and expansion of the metal structure gradually progresses towards the inner side of the insulated circuit board 2. As a result, circuit resistance increases and heat-dissipating ability decreases within the device, eventually leading to failure of the semiconductor device 1. This represents the so-called lifetime of the semiconductor device 1. As described above, these phenomena occur due to differences between the coefficients of thermal expansion of device materials such as those of the IGBT device 3 and the bonding material S on either side of the interface B, and these differences in coefficients of thermal expansion cause tensile and compressive forces to be applied to the edge of the interface B at certain times. Furthermore, due to these forces and thermal energy, the metal crystal grains of the bonding material S expand and lose strength as a result of so-called metal fatigue. Moreover, the phenomena described above are most prone to occurring at corners (the four corners) of the IGBT device 3.

Therefore, the present inventor focused on items such as the differences in coefficients of thermal expansion due to differences in material properties of the bonding material S and semiconductor elements such as the IGBT devices 3 and the diode devices 4, the wetting properties and surface tension of the bonding material S on the metal layer 21 and the insulating board 20, and the locations where cracking can occur in the bonding surface, and thereby arrived at the present invention. More specifically, as illustrated in FIGS. 2A and 3B, in the present embodiment recesses 23 are formed in the metal layer 21 at positions corresponding to the corners 32 at the four corners of the IGBT device 3 (and the corners 42 of the diode device 4).

As illustrated in FIGS. 2A and 2B, the recesses 23 are formed in right triangle shapes overlapping with the corners 32 at the four corners of the IGBT device 3 when viewed in a plan view. Moreover, the angle θ between a side of the IGBT device 3 and the hypotenuse of each recess 23 is equal to 135°.

Furthermore, as illustrated in FIGS. 3A and 3B, each recess 23 is formed to a depth that exposes the insulating board 20. In other words, the bottom surface 23a of the recess 23 is the surface of the insulating board 20. Moreover, the side face (inner sidewall) 23b of the recess 23, which is positioned towards the inner side of the planar direction of the insulated circuit board 2, is positioned further towards the inner side (center side) of the insulated circuit board 2 than the corner 32 of the IGBT device 3. Meanwhile, the side face (outer sidewall) 23c of the recess 23, which is positioned towards the outer side of the planar direction of the insulated circuit board 2, is positioned further towards the outer side (the side opposite to the center side) of the insulated circuit board 2 than the corner 32 of the IGBT device 3. The recess 23 is defined by the bottom surface 23a, the inner-side side face 23b and the outer-side side face 23c. The side face 23b and the side face 23c should be arranged so as to form a right triangle when viewed in a plan view. The side face 23b should be arranged as the hypotenuse, and the side face 23c should be arranged as the sides on either side of the right angle.

The bonding material S that bonds together the IGBT device 3 and the metal layer 21 forms a fillet F at the edge of the bonding material S so as to smoothly connect from the opposite face (bottom surface 32a) of the IGBT device 3 that faces the recess 23 to the inner-side side face 23b of the metal layer 21 that defines the recess. More specifically, as illustrated in FIG. 3B, the fillet F includes a fillet F1 that concaves from the bottom surface 32a of the IGBT device 3 inwards towards the side face 23b of the metal layer 21 as well as a fillet F2 that connects to the corner at the bottom edge of the recess 23 along the side face 23b.

The fillet F1 is formed in an arc shape having a curvature that concaves in towards the center of the insulated circuit board 2. The fillet F2 is formed connecting to the bottom edge of the fillet F1 and bulging out with a prescribed thickness relative to the side face 23b. Moreover, at the corner at the bottom edge of the recess 23 (the location at which the bottom surface 23a and the side face 23b intersect), the fillet F2 is formed in an arc shape having a curvature that runs smoothly to the bottom surface 23a.

In this way, the fillet F is formed so as to avoid the space beneath the corner 32. This is due to the physical and chemical properties of the bonding material S, which cause the bonding material S to be more prone to being close (easily wetting) against the metal layer 21 but less prone to being close (less wetting) against the insulating board 20. In other words, a space X in which there is no bonding material S is formed between the recess 23 and the corner 32 of the IGBT device 3 that faces the recess 23.

In the configuration described above, setting the angle θ between a side of the IGBT device 3 and the hypotenuse of each recess 23 to be 135° as illustrated in FIG. 2 makes it possible to reduce stress concentration at the interface B near the corners 32. Moreover, forming the recesses 23 at prescribed locations of the metal layer 21 corresponding to the corners 32 makes it possible to form spaces X in which there is no bonding material S beneath the corners 32, thereby making it possible to effectively reduce stress concentration at the interface B near the corners 32. Furthermore, forming the fillet F in the bonding material S to have a shape that concaves in towards the inner side of the insulated circuit board 2 makes it possible to reduce offsets of the interface B when exposed to high-temperature environments and low-temperature environments, thereby making it possible to inhibit progression of cracking. In other words, in the present embodiment, the recesses 23 formed in the metal layer 21 make it possible to disperse and reduce stress concentration at the interface B near the corners 32 of the IGBT device 3. This makes it possible extend lifetime by reducing thermal history-related stress concentration in comparison to conventional structures, even over long periods of operation.

Here, the amount of bonding material S should be selected appropriately in accordance with the area of the semiconductor element, the type of bonding material S, and the processes used so that the bonding material S forms an appropriate fillet and does not extend onto the ceramic portion (the insulating board 20) of the insulated circuit board 2.

Next, a method of manufacturing the semiconductor device according to the present embodiment will be described with reference to FIG. 5. FIG. 5 is schematic drawings illustrating the method of manufacturing the semiconductor device according to the present embodiment. FIGS. 5A to 5D are process diagrams illustrating steps in the method of manufacturing the semiconductor device according to the present embodiment. It should be noted that the method of manufacturing a semiconductor device described below is nothing more than an example and is not limited to this configuration and can be modified as appropriate.

As illustrated in FIG. 5, the method of manufacturing the semiconductor device according to the present embodiment includes a step of preparing an insulated circuit board 2 in which a circuit pattern is formed by a metal layer 21 on an insulating board 20, a semiconductor element arrangement step of arranging an IGBT device 3 on the metal layer 21, and a bonding step of bonding the IGBT device 3 to the metal layer 21.

Figure 5A:
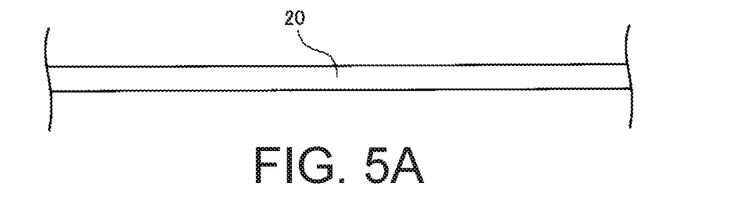
FIGS. 5A through 5D are schematic drawings illustrating a method of manufacturing a semiconductor manufacture device according to an embodiment.
Figure 5B:
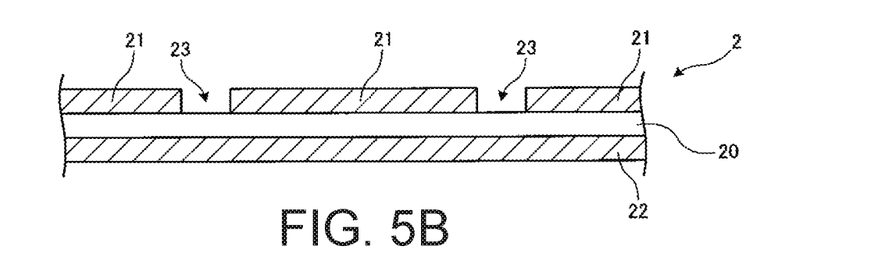

First, as illustrated in FIG. 5A, the insulating board 20 is prepared in advance. Next, a circuit pattern is formed. As illustrated in FIG. 5B, in this circuit pattern formation step, metal layers 21 and 22 are respectively formed on the upper surface and lower surface of the insulating board 20. The circuit pattern in the metal layer 21 can be formed by applying a masking treatment corresponding to the shape of the circuit pattern to the surface of the insulating board 20 and then performing a copper foil etching process, for example. At this time, by forming the mask to have a prescribed shape at positions corresponding to corners 32 of the IGBT device 3, recesses 23 can be formed exposing the surface of the insulating board 20. In this way, the insulated circuit board 2 is prepared.

Figure 5C:
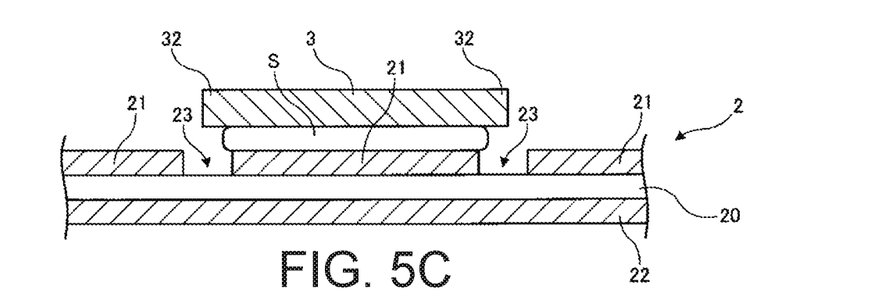
Figure 5D:
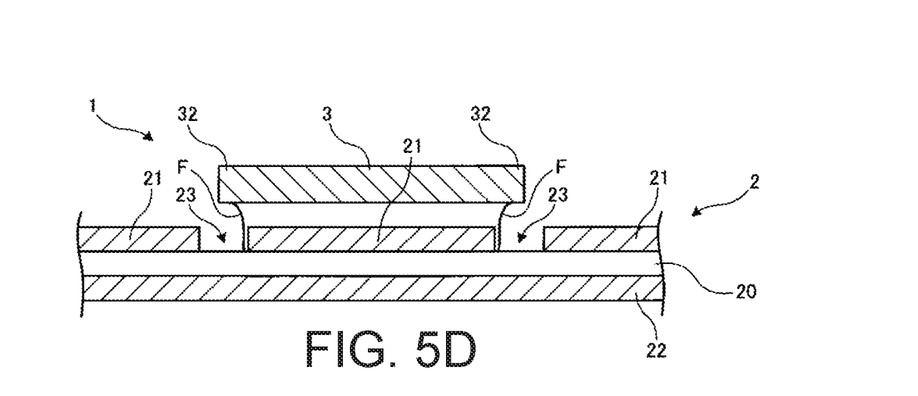

Next, the semiconductor element arrangement step is performed. As illustrated in FIG. 5C, in the semiconductor element arrangement step, the IGBT device 3 is arranged on the metal layer 21 via a bonding material S. The bonding material S is arranged on the metal layer 21 over an area equal in size to the bonding surface (bottom surface) of the IGBT device 3 minus the locations corresponding to the recesses 23.

Next, the bonding step is performed. In the bonding step, the bonding material S is melted by applying heat and then hardened by cooling to bond the IGBT device 3 to the metal layer 21. For example, the insulated circuit board 2 and the IGBT device 3 in the state illustrated in FIG. 5C are inserted into a furnace and heated to the melting temperature of the bonding material S. The bonding material S melts and forms the fillet F between the IGBT device 3 and the insulated circuit board 2 (see FIG. 5D) and is then hardened by cooling such that a connecting member is electrically connected to the metal layer 21. The semiconductor device 1 is thus manufactured by completing the steps described above.

In the configuration described above, during the circuit pattern formation step, the recesses 23 can be formed at the same time as the circuit pattern constituted by the metal layer 21. Moreover, the recesses 23 can be formed simply by changing the mask jig or the like in accordance with the recesses 23, without having to change out existing production equipment. Therefore, the advantageous effect of extending the lifetime of a semiconductor device can be achieved with a simple configuration and without negatively impacting production equipment throughput or production costs.

Figure 6:
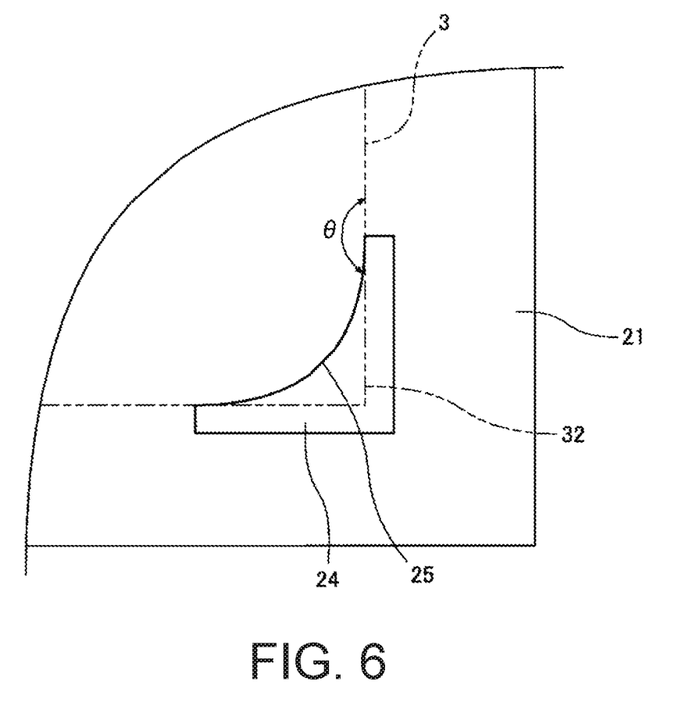
FIG. 6 is a plan view schematically illustrating a recess according to a modification example.

Next, a modification example will be described. Although in the embodiment above the recesses 23 were described as being formed to have a triangular shape when viewed in a plan view and the angle θ between a side of the IGBT device 3 and the hypotenuse was described as being equal to 135°, the present invention is not limited to this configuration. The configuration illustrated in FIG. 6 is also possible. FIG. 6 is a plan view schematically illustrating a recess according to the modification example. In a recess 24 illustrated in FIG. 6, the portion corresponding to the hypotenuse of the recess 23 in the embodiment described above is different in terms of being formed in an arc shape. More specifically, the recess 24 has an arc portion 25 that, when viewed in a plan view, curves so as to be adjacent to or tangential to two sides of the IGBT device 3 that define the corner 32. This configuration makes it possible to make the angle θ between a side of the IGBT device 3 and the arc portion 25 close to or equal to 180°, thereby making it possible to reduce stress concentration more effectively than in the embodiment described above. Moreover, the size of the recess can be modified as appropriate on the basis of the relationship with the bond strength between the IGBT device 3 and the metal layer 21. For example, from the perspective of achieving a balance between bond strength and the degree of reduction in stress concentration, it would be conceivable to set the size to the size of the recess 23.

Furthermore, although in the embodiment described above two semiconductor elements (one IGBT device 3 and one diode device 4) are arranged on each insulated circuit board 2, the present invention is not limited to this configuration. The number of semiconductor elements may be one or may be three or more.

Moreover, although in the embodiment described above the semiconductor elements are formed to have a rectangular shape when viewed in a plan view, the present invention is not limited to this configuration. The semiconductor elements may be formed to have polygonal shapes other than rectangles.

Moreover, although in the embodiment above four of the recesses 23 were described as being respectively formed at the four corners of each semiconductor element, the present invention is not limited to this configuration. A single recess 23 can be formed corresponding to at least one of the corners of the semiconductor element. In this case, it is preferable that the recess 23 be formed corresponding to the corner positioned furthest towards the outer peripheral side of the insulated circuit board 2. This is because being further towards the outer peripheral side is more effective for reducing stress concentration.

In addition, although the embodiment and a modification example thereof were described above, the embodiment and modification example described above can be combined partially or entirely as another embodiment.

Moreover, the present invention is not limited to the embodiment and modification example described above, and various changes, replacements, or alterations may be made without departing from the spirit of the technical concepts herein. Furthermore, if due to technological progress or other derived technologies it becomes possible to achieve the technical concepts herein by other methods, the present invention may be implemented using such other methods. Therefore, the claims cover all embodiments that can be included within the scope of the technical concepts herein.

The semiconductor device according to at least some of the embodiments described above includes: an insulated circuit board including an insulating board and a metal layer on the insulating board; and a semiconductor element mounted on the metal layer via a bonding material that covers a substantially entire back surface of the semiconductor element, the semiconductor element having a polygonal shape when viewed in a plan view, wherein the metal layer of the insulated circuit board has a recess that exposes the insulating board thereunder to accommodate an edge of the bonding material, at a position corresponding to at least one corner of the semiconductor element.

Moreover, in the semiconductor device described above, a space in which the bonding material is not present may be formed between the recess and the corner of the semiconductor element that faces the recess.

Furthermore, in the semiconductor device described above, the bonding material may form a fillet connecting from the back surface of the semiconductor element that faces the recess to an inner sidewall of the recess.

In addition, in the semiconductor device described above, the semiconductor element may have a rectangular shape when viewed in a plan view, and the recess may be formed at each of positions corresponding to four corners of the semiconductor element. The recess may be absent in the metal layer under respective sides of the rectangular shape of the semiconductor element except under the four corners of the semiconductor element.

Moreover, in the semiconductor device described above, the recess may have a triangular shape that overlaps with the corner when viewed in a plan view.

Furthermore, in the semiconductor device described above, the recess may have an arc portion that, when viewed in a plan view, curves so as to be adjacent to or tangential to two sides of the semiconductor element that define the corner.

In addition, a method of manufacturing a semiconductor device according to at least some of the embodiments described above includes: preparing an insulated circuit board that includes an insulating board and a circuit pattern made of a metal layer on the insulating board; arranging a semiconductor element on the metal layer with a bonding material interposed therebetween, covering a substantially entire back surface of the semiconductor element, the semiconductor element having a polygonal shape when viewed in a plan view; and melting and thereafter hardening the bonding material so as to bond the semiconductor element to the metal layer, wherein the circuit pattern of the insulated circuit board has a recess that exposes the insulating board thereunder to accommodate an edge of the melted and hardened bonding material at a position corresponding to at least one corner of the semiconductor element.

As described above, the present invention has the advantageous effect of making it possible to extend lifetime by reducing thermal history-related stress concentration, even over long periods of operation, and is particularly effective in semiconductor devices and methods of manufacturing semiconductor devices.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device, comprising:
   an insulated circuit board including an insulating board and a metal layer on the insulating board; and
   a semiconductor element mounted on the metal layer via a bonding material that covers a substantially entire back surface of the semiconductor element, the semiconductor element having a polygonal shape when viewed in a plan view,
   wherein the metal layer of the insulated circuit board has a recess that exposes the insulating board thereunder to accommodate an edge of the bonding material, at a position corresponding to at least one corner of the semiconductor element,
   wherein a space in which the bonding material is not present is formed between the recess and the back surface of the semiconductor element at said at least one corner that faces the recess, thereby exposing the back surface of the semiconductor element at said at least one corner, and
   wherein the bonding material is electrically conductive.

2. The semiconductor device according to claim 1, wherein the bonding material forms a fillet connecting from the back surface of the semiconductor element that faces the recess to an inner sidewall of the recess.

3. The semiconductor device according to claim 1,
   wherein the semiconductor element has a rectangular shape when viewed in a plan view, and
   wherein the recess is formed at each of positions corresponding to four corners of the semiconductor element.

4. The semiconductor device according to claim 1, wherein the recess has a triangular shape that overlaps with the corner when viewed in a plan view.

5. The semiconductor device according to claim 1, wherein the recess has an arc portion that, when viewed in a plan view, curves so as to be adjacent to or tangential to two sides of the semiconductor element that define the corner.

6. The semiconductor device according to claim 1,
wherein the semiconductor element has a rectangular shape when viewed in a plan view,
wherein the recess is formed in the metal layer at each of positions corresponding to four corners of the semiconductor element, and the recess is absent in the metal layer under respective sides of the rectangular shape of the semiconductor element except under the four corners of the semiconductor element, and
wherein at each corner of the semiconductor element, the bonding material forms a fillet connecting from the back surface of the semiconductor element that faces the recess to an inner sidewall of the recess.

7. The semiconductor device according to claim 6, wherein at each corner of the semiconductor element, the recess has a triangular shape that overlaps with the corner when viewed in a plan view.

8. The semiconductor device according to claim 6, wherein at each corner of the semiconductor element, the recess has an arc portion that, when viewed in a plan view, curves so as to be adjacent to or tangential to two sides of the semiconductor element that define the corner.

9. A method of manufacturing a semiconductor device, comprising:
preparing an insulated circuit board that includes an insulating board and a circuit pattern made of a metal layer on the insulating board;
arranging a semiconductor element on the metal layer with a bonding material interposed therebetween, covering a substantially entire back surface of the semiconductor element, the semiconductor element having a polygonal shape when viewed in a plan view; and
melting and thereafter hardening the bonding material so as to bond the semiconductor element to the metal layer,
wherein the circuit pattern of the insulated circuit board has a recess that exposes the insulating board thereunder to accommodate an edge of the melted and hardened bonding material, at a position corresponding to at least one corner of the semiconductor element,
wherein a space in which the bonding material is not present is formed between the recess and the back surface of the semiconductor element at said at least one corner that faces the recess, thereby exposing the back surface of the semiconductor element at said at least one corner, and
wherein the bonding material is electrically conductive.

* * * * *